United States Patent
Park et al.

(10) Patent No.: US 12,181,530 B2
(45) Date of Patent: Dec. 31, 2024

(54) APPARATUS FOR ESTIMATING RECHARGEABLE BATTERY PERFORMANCE ACCORDING TO ELECTRODE STRUCTURE AND METHOD THEREOF

(71) Applicant: LG ENERGY SOLUTION, LTD., Seoul (KR)

(72) Inventors: Ji Hye Park, Daejeon (KR); Wontae Joe, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 268 days.

(21) Appl. No.: 17/922,762

(22) PCT Filed: Jul. 27, 2021

(86) PCT No.: PCT/KR2021/009694
§ 371 (c)(1),
(2) Date: Nov. 1, 2022

(87) PCT Pub. No.: WO2022/071652
PCT Pub. Date: Apr. 7, 2022

(65) Prior Publication Data
US 2023/0194617 A1     Jun. 22, 2023

(30) Foreign Application Priority Data

Sep. 29, 2020 (KR) .................. 10-2020-0126849

(51) Int. Cl.
*G01R 31/382* (2019.01)
*G01N 15/08* (2006.01)
(Continued)

(52) U.S. Cl.
CPC .......... *G01R 31/382* (2019.01); *G01N 15/08* (2013.01); *H01M 10/4285* (2013.01); *H01M 10/48* (2013.01)

(58) Field of Classification Search
CPC .. G01R 31/382; G01R 31/3865; G01N 15/08; G01N 15/088; H01M 10/4285; H01M 10/48
See application file for complete search history.

(56) References Cited

U.S. PATENT DOCUMENTS

2008/0241692 A1 * 10/2008 Saruwatari ............ H01M 4/661
429/231.95
2008/0268338 A1    10/2008 Lee et al.
(Continued)

FOREIGN PATENT DOCUMENTS

EP    3 694 028 A1    8/2020
JP    8-213040 A      8/1996
(Continued)

OTHER PUBLICATIONS

International Search Report for PCT/KR2021/009694 (PCT/ISA/210) mailed on Nov. 10, 2021.
(Continued)

*Primary Examiner* — David Z Huang
(74) *Attorney, Agent, or Firm* — Birch, Stewart, Kolasch & Birch, LLP

(57) ABSTRACT

Discussed is an apparatus for estimating a rechargeable battery performance according to an electrode structure and a method thereof and the apparatus for estimating the rechargeable battery performance. The apparatus may include a communication unit that receives a cumulative intrusion value that is a summed value of volumes of entire pores per unit area of a positive electrode from an apparatus for measuring volumes of pores formed in the positive electrode, and a processor that estimates an output perfor-
(Continued)

mance of a rechargeable battery by comparing the cumulative intrusion value and a volume reference value, wherein the volume reference value is the cumulative intrusion value corresponding to an expected output value required for the rechargeable battery when the rechargeable battery is continuously discharged.

10 Claims, 26 Drawing Sheets

(51) Int. Cl.
*H01M 10/42* (2006.01)
*H01M 10/48* (2006.01)

(56) References Cited

U.S. PATENT DOCUMENTS

| | | |
|---|---|---|
| 2009/0285358 A1 | 11/2009 | Ballard et al. |
| 2013/0224586 A1 | 8/2013 | Nagai et al. |
| 2018/0219212 A1 | 8/2018 | Seol et al. |
| 2018/0241029 A1 | 8/2018 | Nagai et al. |
| 2018/0248195 A1 | 8/2018 | Choi et al. |
| 2020/0141841 A1 | 5/2020 | Han |
| 2020/0185697 A1* | 6/2020 | Kim .............. G01R 31/08 |
| 2020/0203724 A1 | 6/2020 | Hagiwara et al. |

FOREIGN PATENT DOCUMENTS

| | | |
|---|---|---|
| JP | 2015-60656 A | 3/2015 |
| JP | 2017-4635 A | 1/2017 |
| JP | 2018-535520 A | 11/2018 |
| JP | 2020-507889 A | 3/2020 |
| JP | 2020-517953 A | 6/2020 |
| KR | 10-2001-0019773 A | 3/2001 |
| KR | 10-0869806 B1 | 11/2008 |
| KR | 10-2013-0049920 A | 5/2013 |
| KR | 10-1427976 B1 | 8/2014 |
| KR | 10-1504049 B1 | 3/2015 |
| KR | 10-2018-0005060 A | 1/2018 |
| KR | 10-1938237 B1 | 1/2019 |
| KR | 10-2024890 B1 | 9/2019 |
| KR | 10-2020-0010932 A | 1/2020 |
| KR | 10-2128010 B1 | 6/2020 |

OTHER PUBLICATIONS

Extended European Search Report for European Application No. 21875927.2, dated Jan. 16, 2024.

Froboese et al., "Mercury intrusion for ion- and conversion-based battery electrodes—Structure and diffusion coefficient determination," Materials Characterization, vol. 133, 2017, pp. 102-111.

* cited by examiner

APPARATUS FOR ESTIMATING RECHARGEABLE BATTERY PERFORMANCE ACCORDING TO ELECTRODE STRUCTURE AND METHOD THEREOF

CROSS-REFERENCE TO RELATED APPLICATION

This application claims priority to and the benefit of Korean Patent Application No. 10-2020-0126849 filed in the Korean Intellectual Property Office on Sep. 29, 2020, the entire contents of which are incorporated herein by reference.

TECHNICAL FIELD

The present invention relates to an apparatus for estimating rechargeable battery performance according to an electrode structure, and a method thereof.

BACKGROUND ART

As a demand for lithium rechargeable batteries changes from small portable electronic devices to medium and large electric vehicles (EVs) and energy storage systems (ESS), the required battery characteristics are also changing significantly. As well as significantly strengthened requirements such as long-term reliability of more than 10 years, safety of a pack level, and price competitiveness security compared to existing small batteries, a high power characteristic and fast charging performance are also required.

Recently, there have been attempts to improve an output by improving a movement speed of electrons or improving a movement speed of ions. For example, there have been various attempts such as changing the structure of the electrode of the rechargeable battery to improve the movement speed of the ions ($Li^+$). What is needed accompanying this is a method of measuring or estimating how much the movement speed of the ions is improved by changing the electrode structure, etc., and determining how much the output of the rechargeable battery is improved as a result.

However, in order to measure the output of the rechargeable battery, since the voltage and the current must be simultaneously measured and controlled, it is much more difficult than measuring the capacity of a conventional unit battery cell. In addition, It is pointed out as a problem because the measured value tends to vary greatly depending on the measurement conditions such as an output holding time, a state-of-charge (SOC), a cut-off condition, and a measurement temperature, as well as the selection of the method for measuring the output of the rechargeable battery.

Therefore, there is a need for a method that can easily and accurately estimate how much the output performance or the rapid charging performance of the rechargeable battery has improved due to the improvement of the movement speed of the ions depending on the change of the electrode structure and the like.

DISCLOSURE

Technical Problem

The present invention provides an apparatus for estimating rechargeable battery performance and a method thereof according to an electrode structure for estimating performance of the rechargeable battery by comparing a cumulative intrusion value of the electrode with a volume reference value based on correlation cumulative intrusion, tortuosity, polarization resistance (Rpola), and battery performance.

The present invention provides an apparatus for estimating rechargeable battery performance and a method thereof according to an electrode structure for estimating performance of the rechargeable battery based on a cumulative intrusion value for pores with a diameter greater than or equal to 0.1 micrometers and less than or equal to 1 micrometer.

Technical Solution

An apparatus for estimating a rechargeable battery performance of the present invention may include: a communication unit that receives a cumulative intrusion value that is a summed value of volumes of entire pores per unit area of a positive electrode from an apparatus for measuring volumes of pores formed in the positive electrode; and a processor that estimates an output performance of a rechargeable battery by comparing the cumulative intrusion value and a volume reference value, wherein the volume reference value is a cumulative intrusion value corresponding to an expected output value required for the rechargeable battery when the rechargeable battery is continuously discharged.

In this context, the pores may have the diameter of 0.1 micrometer or more and 1 micrometer or less.

The processor, when the cumulative intrusion value is equal to or greater than the volume reference value, may determine that the rechargeable battery including the positive electrode satisfies the expected output value.

An apparatus for estimating a rechargeable battery performance of the present invention may include: a communication unit that receives a cumulative intrusion value that is a summed value of volumes of entire pores per unit area of a negative electrode from an apparatus for measuring volumes of pores formed in the negative electrode; and a processor that estimates charging performance of a rechargeable battery by comparing the cumulative intrusion value an a volume reference value, wherein the volume reference value is a cumulative intrusion value corresponding to an expected state-of-charge (SOC) value required for the rechargeable battery at a charge end time when the rechargeable battery is continuously charged.

In this context, the pores may have the diameter of 0.1 micrometer or more and 1 micrometer or less.

The processor, when the cumulative intrusion value is equal to or greater than the volume reference value, may determine that the rechargeable battery including the negative electrode satisfies the expected SOC value.

A method for estimating a rechargeable battery performance of the present invention may include: receiving a cumulative intrusion value that is a summed value of volumes of entire pores per unit area of a positive electrode from an apparatus for measuring volumes of pores formed in the positive electrode; comparing the cumulative intrusion value and a volume reference value; and determining that a rechargeable battery including the positive electrode satisfies an expected output value when being continuously discharged when the cumulative intrusion value is equal to or greater than the volume reference value as a comparison result, wherein the volume reference value is the cumulative intrusion value corresponding to a lowest value of the expected output value.

In this context, the pores may have the diameter size of 0.1 micrometer or more and 1 micrometer or less.

A method for estimating a rechargeable battery performance of the present invention may include: receiving a cumulative intrusion value that is a summed value of volumes of entire pores per unit area of a negative electrode from an apparatus for measuring volumes of pores formed in the negative electrode; comparing the cumulative intrusion value and a volume reference value; and determining that the rechargeable battery including the negative electrode satisfies an expected state-of-charge SOC value at a charge end time when being continuously charged when the cumulative intrusion value is equal to or greater than the volume reference value as a comparison result, wherein the volume reference value is the cumulative intrusion value corresponding to the expected SOC value.

In this context, the pores may have the diameter size of 0.1 micrometer or more and 1 micrometer or less.

Advantageous Effects

The present invention may estimate the improvement degree of the output performance or the rapid charging performance of the rechargeable battery through the simple method for measuring the cumulative intrusion of the electrode.

The present invention estimates the output performance or the rapid charging performance in an electrode state, and if it does not meet a predetermined condition, the rechargeable battery (battery cell) may not be manufactured, so it has a cost-saving effect.

MODE FOR INVENTION

Figure 1:
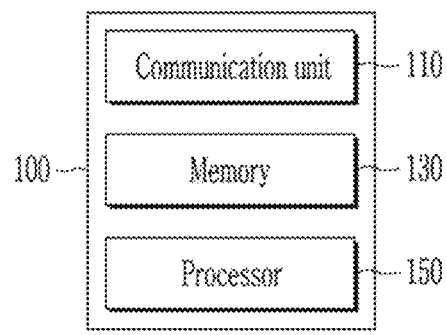
FIG. 1 is a block diagram explaining an apparatus for estimating rechargeable battery performance according to an embodiment.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to easily make a specification. Therefore, these terms do not have meanings or roles that distinguish them from each other in themselves. Further, in describing embodiments of the present specification, when it is determined that a detailed description of the well-known art associated with the present invention may obscure the gist of the present invention, it will be omitted. In addition, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to another component or may be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 is a block diagram explaining an apparatus for estimating a rechargeable battery performance according to an embodiment.

Referring to FIG. 1, the apparatus 100 for estimating the rechargeable battery performance includes a communication unit 110, a memory 130, and a processor 150.

A rechargeable battery is a battery composed of at least one electrochemical cell that can be repeatedly charged and discharged. Hereinafter, the rechargeable battery is described as a lithium ion (Li-ion) rechargeable battery that produces electricity by a chemical reaction of lithium, but is not limited thereto, and it may include a rechargeable battery that may be repeatedly charged and discharged such as a nickel cadmium (NiCd) battery, a nickel metal hydride (NiMH) battery, etc.

The rechargeable battery may be composed of a positive electrode (a cathode), a negative electrode (an anode), an electrolyte solution, and a separator.

The positive electrode may be coated with a mixture in which a positive active material, a conductive agent, and a binder are mixed on a thin aluminum base material that holds a shape of the positive electrode. The positive active material is a material containing lithium ions ($Li^+$), which are unstable in an elemental state, such as a lithium oxide in which lithium is combined with oxygen. That is, the positive active material provides lithium ions ($Li^+$) during charging, and is a material that is involved in the electrode reaction of the actual battery. The conductive agent functions to increase the conductivity of the positive active material with low electrical conductivity. The binder acts as a kind of adhesive that helps the active material and the conductive agent to settle well on the aluminum base material.

For the negative electrode, a negative active material, a conductive agent, and a binder are coated on a copper base material. The negative active material stores lithium ions ($Li^+$) during the charging, and graphite with a stable structure is mainly used. Graphite has many attributes that the negative active material must have: structural stability, low electronic chemical reactivity, and a condition that it can store a lot of lithium ions ($Li^+$). The negative active material allows the current to flow through the external circuit, while reversibly absorbing and releasing lithium ions ($Li^+$) discharged from the positive electrode.

The electrolyte solution is a medium that allows lithium ions ($Li^+$) to move between the positive and the negative electrodes. As the electrolyte solution, a material with high ion conductivity may be used to move lithium ions ($Li^+$) well. The electrolyte solution may consist of salts, solvents, and additives. The salt is a passage through which lithium ions ($Li^+$) can pass, the solvent is an organic liquid used to dissolve the salt, and the additive is a material added in a small amount for a specific purpose.

The separator is a porous polymer film that physically blocks the positive and the negative electrodes from contacting each other. Also, lithium ions ($Li^+$) may move through the pores formed in the separator. For example, if the positive electrode and the negative electrode are in direct contact, the battery may be short-circuited or explode.

The performance required for the rechargeable battery 10 varies depending on the environment in which it is used. For example, the output performance of the rechargeable battery 10 is such that it is able to provide electrical energy for a unit t. For example, the electrical energy required for executing an image is greater than the electrical energy required for executing a phone call on a smartphone, and at this time, the output of the rechargeable battery 10 that provides the electrical energy to the smartphone is also determined accordingly. For example, if the movement speed of the electrons is improved or the movement speed of the lithium ions ($Li^+$) is improved, the output that the rechargeable battery 10 may provide may also be improved.

The communication unit 110 includes an apparatus (not shown) for measuring the volume of pores formed in an electrode through a wired/wireless network, for example, a communication module for being connected to a pore measuring device (ex., a porosimeter). For example, the communication unit 310 may include at least one communication module among a wired Internet, a wireless Internet such as WiFi, a portable internet such as WiBro or WiMAX, a 2G mobile communication network such as GSM or CDMA, a 3G mobile communication network such as WCDMA or CDMA 2000, a 3.5G mobile communication network such as HSDPA or HSUPA, a 4G mobile communication network such as an LTE network, and a 5G mobile communication network.

The communication unit 110 may receive a cumulative intrusion value, which is a sum value of a volume of entire pores of the positive electrode or the negative electrode per unit area transmitted from the porosimeter through the network to be transmitted to the processor 150 and to be stored to the memory 130 through the control of the processor 150.

The memory 130 may store the cumulative intrusion value of the positive electrode or the negative electrode received through the communication unit 110.

The processor 150 compares the cumulative intrusion value, which is the sum value of the volume of the entire pores per unit area of the electrodes from the porosimeter through the communication unit 310, with a volume reference value, thereby the performance of the rechargeable battery may be estimated.

According to an embodiment, the processor 150, if the cumulative intrusion value of the positive electrode is more than the first volume reference value, determines that the output performance of the rechargeable battery configured of the corresponding positive electrode (the cathode) satisfies an expected output value. According to an embodiment, the processor 150 may estimate the output performance of the rechargeable battery including the positive electrode to be verified in the electrode state, even without actually assembling the rechargeable battery including the positive electrode. According to another embodiment, the processor 150 may determine that the charging performance of the rechargeable battery composed of the corresponding negative electrode (the anode) satisfies the expected charging performance if the cumulative intrusion value of the negative electrode (the anode) is equal to or greater than a second volume reference value. Specifically, the expected charging performance corresponds to the SOC (state-of-charge) value of the charge end time when the rechargeable battery is continuously charged. According to an embodiment, the processor 150 may estimate the charging performance of the rechargeable battery including the negative electrode to be verified in the electrode state, even if the rechargeable battery including the negative electrode is not actually assembled.

The first volume reference value may be a cumulative intrusion value corresponding to an expected output value required for the rechargeable battery when the rechargeable battery is continuously discharged. The second volume reference value may be a cumulative intrusion value corresponding to an expected SOC (state-of-charge) value required for the rechargeable battery at the charge end time when the rechargeable battery is continuously charged.

As the cumulative intrusion value increases, the tortuosity value, which reflects the structural characteristics of the pores, decreases. Then, a value of a polarization resistance (polarization resistor, Rpola) is also reduced, and battery output performance or charging performance is increased. At this time, the cumulative intrusion value shows an inversely proportional relationship to the tortuosity value, and as the tortuosity value decreases, the polarization resistance (Rpola) value also tends to decrease correspondingly. Also, as the polarization resistance (Rpola) value is lower, the output performance or the charging performance of the rechargeable battery increases. A more detailed description is now explained along with FIG. 3 to FIG. 26.

Figure 2:
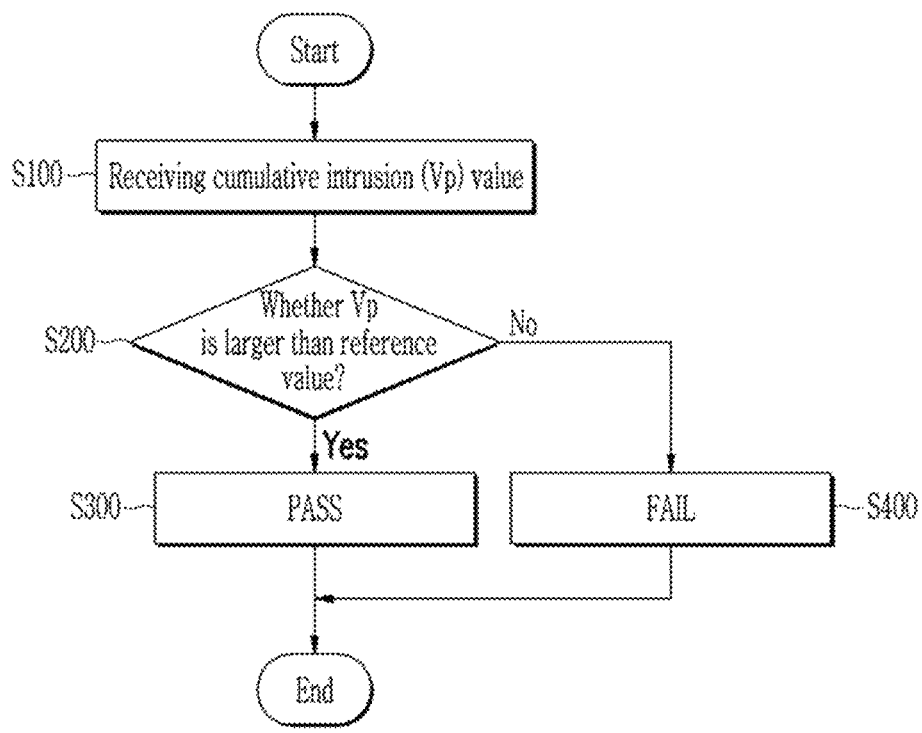
FIG. 2 is a flowchart explaining a method for estimating rechargeable battery performance according to an embodiment.

FIG. 2 is a flowchart explaining a method for estimating performance of a rechargeable battery according to an electrode structure according to an embodiment.

Referring to FIG. 2, first, the apparatus 100 for estimating the rechargeable battery performance receives the cumulative intrusion value of the sum value of the volume of the entire pores per unit area transmitted from the porosimeter for measuring the volume of the pores formed in the electrode (S100).

The porosimeter may measure a size and distribution of pores of the polymer, and the total pore volume for a predetermined area. The size of the pores in the electrode may be varied, and the porosimeter may detect the cumulative intrusion value for each pore size by using a characteristic that a mercury intrusion pressure varies according to the size of the pores.

According to an embodiment, the apparatus 100 for estimating the rechargeable battery performance may receive the cumulative intrusion value that is the summed value of the volume of the entire pores per unit area of the positive electrode (the cathode) from the porosimeter.

According to another embodiment, the apparatus 100 for estimating the rechargeable battery performance may receive the cumulative intrusion value that is the summed value of the volume of the entire pores per unit area of the negative electrode (the anode) from the porosimeter.

Next, the apparatus 100 for estimating the rechargeable battery performance compares the cumulative intrusion value and the volume reference value (S200).

According to experimental results according to FIG. 3 to FIG. 26 to be described later, when the cumulative intrusion value increases (1), the tortuosity value, which reflects the structural characteristics of the pores, decreases. As the tortuosity value decreases (2), the polarization resistance (Rpola) value also decreases. At this time, the polarization resistance (Rpola) is a resistance generated by the movement of the ions ($Li^+$), and may be calculated based on the discharge current value obtained by discharging the rechargeable battery with a constant current (CC) and a constant voltage (CV). When the polarization resistance (Rpola) value is decreased (3), the battery performance, i.e., output performance and rapid charging performance, is improved.

In summary, if the cumulative intrusion value increases, the performance of the rechargeable battery improves. For example, if the cumulative intrusion value of the positive electrode increases, the continuous discharge output performance of the rechargeable battery is improved. As another example, if the cumulative intrusion value of the negative electrode increases, the continuous rapid charging performance of the rechargeable battery is improved. At this time, the pores having a correlation with the performance of the rechargeable battery are pores having a diameter of 0.1 micrometer or more and 1 micrometer or less.

According to an embodiment, if there is a performance index expected from a fully assembled rechargeable battery, the cumulative intrusion value corresponding to the performance index may be calculated as a volume reference value. Then, by comparing the cumulative intrusion value measured at the electrode of a verification target and the volume reference value corresponding to the performance index, it may be determined whether the performance of the rechargeable battery including the electrode of the verification target passes (PASS) or does not pass (FAIL).

According to an embodiment, the apparatus 100 for estimating the rechargeable battery performance may preset the cumulative intrusion value corresponding to the output performance index to be expected for the fully assembled rechargeable battery as a first volume reference value. Specifically, the first volume reference value may be a cumulative intrusion value corresponding to the expected output value required for the fully assembled rechargeable battery when the rechargeable battery is continuously discharged.

According to another embodiment, the apparatus 100 for estimating the rechargeable battery performance may preset a cumulative intrusion value corresponding to the charging performance index expected for the fully assembled rechargeable battery as a second volume reference value. Specifically, the second volume reference value may be a cumulative intrusion value corresponding to the expected state-of-charge (SOC) value required for the fully assembled rechargeable battery at the charge end time when the rechargeable battery is continuously charged. At this time, if the SOC value of the charge end time is high, the charging performance of the rechargeable battery also increases.

Next, if the cumulative intrusion value is more than the volume reference value (S200, Yes), the apparatus 100 for estimating the rechargeable battery performance determines that the performance of the rechargeable battery including the corresponding electrode passes the performance index expected from the fully assembled rechargeable battery (PASS) (S300).

According to an embodiment, the apparatus 100 for estimating the rechargeable battery performance, if the cumulative intrusion value of the positive electrode (the cathode) is equal to or greater than the first volume reference value, may determine that the output performance of the rechargeable battery composed of the corresponding positive electrode (the cathode) satisfies the expected output value. The apparatus 100 for estimating the rechargeable battery performance may estimate the output performance of the rechargeable battery including the positive electrode to be verified in the electrode state in which the rechargeable battery is not assembled.

According to another embodiment, the apparatus 100 for estimating the rechargeable battery performance, if the cumulative intrusion value of the negative electrode (the anode) is equal to or more than the second volume reference value, may determine that the charging performance of the rechargeable battery including the corresponding negative electrode (the anode) satisfies the expected charging performance. Specifically, the expected charging performance corresponds to the SOC value of the charge end time when the rechargeable battery is continuously charged. The apparatus 100 for estimating the rechargeable battery performance may estimate the charging performance of the rechargeable battery including the negative electrode to be verified in the electrode state in which the rechargeable battery is not assembled.

Next, if the cumulative intrusion value is less than the volume reference value (S200, No), the apparatus 100 for estimating the rechargeable battery performance determines that the performance of the rechargeable battery including the corresponding electrode does not pass the performance index expected from the fully assembled rechargeable battery (FAIL) (S400).

FIG. 3 to FIG. 26 are experimental data derived from correlations for the cumulative intrusion of the electrodes, the tortuosity, the polarization resistance (Rpola), and the battery performance, and analysis thereof.

Referring to the experimental results of FIG. 3 to FIG. 26, the following contents may be derived. As the cumulative intrusion value increases (1), the tortuosity value, which reflects the structural characteristics of the pores, decreases. As the tortuosity value decreases (2), the polarization resistance (Rpola) value also decreases. At this time, the polarization resistance (Rpola) is the resistance generated by the movement of ions ($Li^+$), and may be calculated based on the discharge current value obtained by discharging the rechargeable battery with the constant current (CC) and the constant voltage (CV). When the polarization resistance (Rpola) value is decreased (3), the battery performance, i.e., the output performance and the rapid charging performance, is improved.

In this case, the cumulative intrusion may be a value obtained by summing the measured pore volumes while sequentially measuring the pore volumes for a plurality of pores having the diameter within a predetermined range. For example, referring to FIG. 3, the cumulative intrusion value on a Y-axis corresponding to a pore size diameter of a 1 micrometer value on an X-axis is about 0.00175 ($mL/cm^2$) for an electrode A. In this case, the cumulative intrusion value 0.00175 ($mL/cm^2$) of the electrode A may means the summed value of the measured pore volumes while sequentially measuring the pore volume from the pores having the diameter of 0.01 micrometer to the pore having the diameter of 1 micrometer. That is, the value of the Y-axis corresponding to the arbitrary pore diameter of the X-axis may be a value obtained by summing the measured pore volumes while sequentially measuring the pore volume from the pore diameter at the start time of the X-axis to the arbitrary pore diameter.

According to the embodiment, the cumulative intrusion, particularly, is most affected by the sum value of the volume of the pores with the diameter of 0.1 micrometer or more and 1 micrometer or less. For example, referring to FIG. 3, the cumulative intrusion value from the pores having the diameter of 0.01 micrometer to the pores having the diameter of 5 micrometers (the X-axis value on the rightmost side of the graph) may depend on the cumulative intrusion to the pores with the diameter of 0.1 micrometer to the pores with the diameter of 1 micrometer. This is described together in detail with reference to FIG. 22 to FIG. 26.

Figure 3:
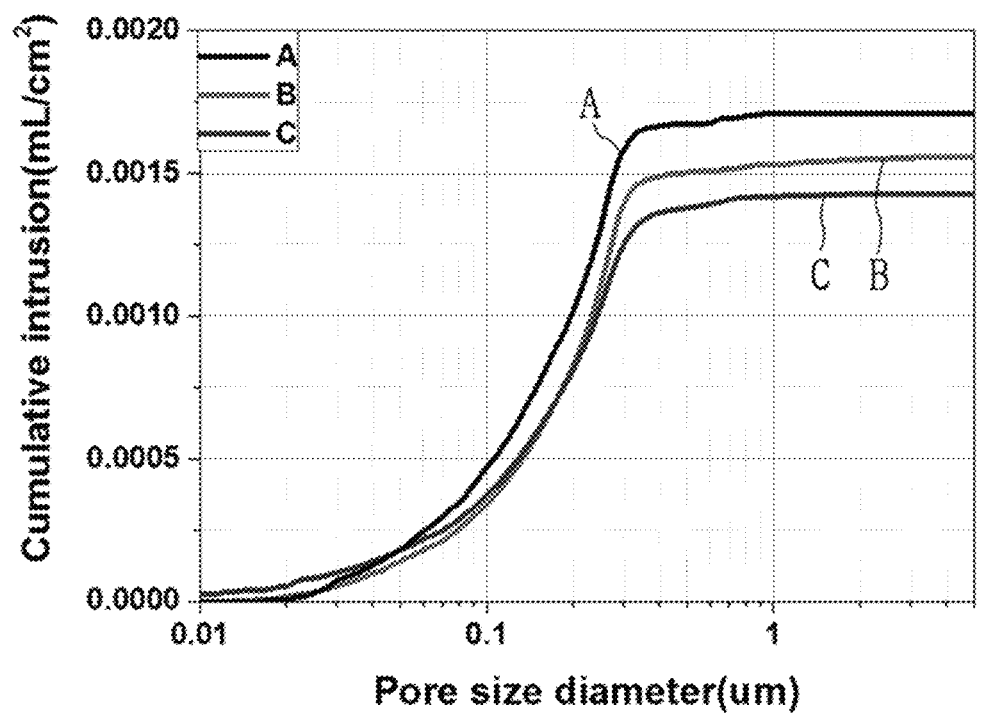
FIG. 3 and FIG. 4 are diagrams explaining a correlation between cumulative intrusion and tortuosity.
Figure 4:
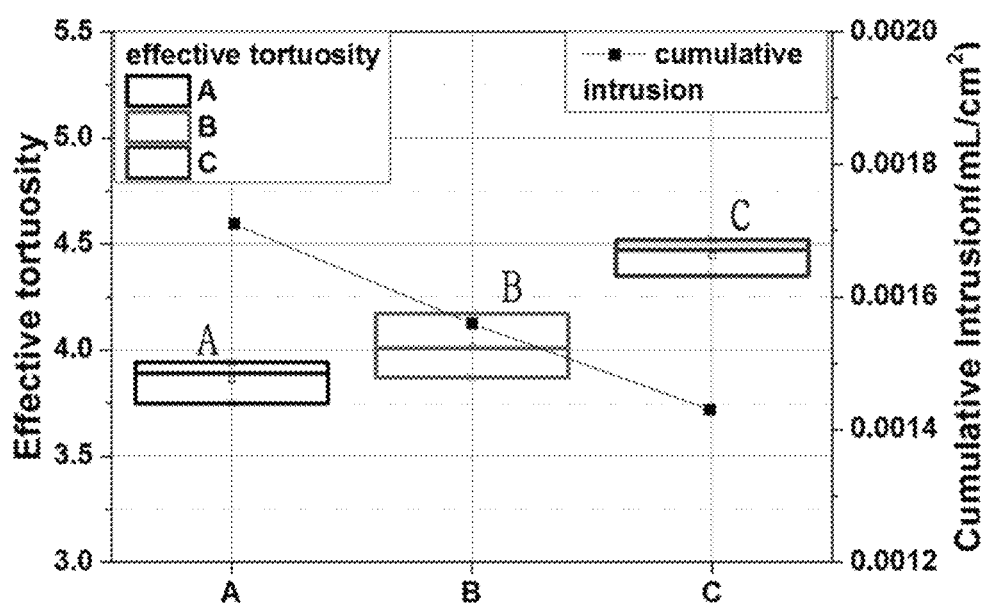

FIG. 3 and FIG. 4 are diagrams explaining a correlation between cumulative intrusion and tortuosity. FIG. 3 displays a cumulative intrusion measured value of a plurality of electrodes A, B, and C of different types of a positive electrode active material, and FIG. 4 shows the correlation of the cumulative intrusion and the tortuosity of a plurality of electrodes A, B, and C shown in FIG. 3.

If the type or amount of the positive electrode active material is changed, the volume and the formation structure of the pores formed of the positive electrode may be changed.

The tortuosity is a value that changes depending on the pore formation structure. If the straight distance between the top and the bottom of the electrode is assumed as 1 and set as a reference value, the tortuosity is a value expressed by comparing the shortest distance that reaches the top and the bottom of the electrode through the pores with the reference value. That is, it may be seen that, as the tortuosity value is closer to 1, the ions move in the shortest straight distance, and as the tortuosity value is larger than 1, the ions moves through another passage.

In summary, as the cumulative intrusion value of the electrode increases (A>B>C), the tortuosity value decreases (A<B<C).

Figure 5:
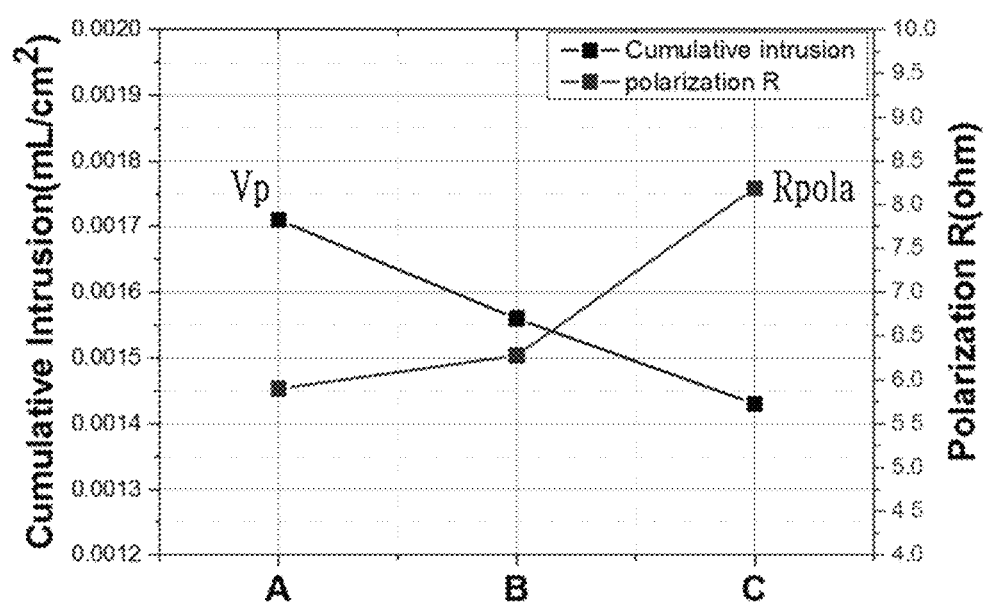
FIG. 5 to FIG. 8 are diagrams explaining a correlation between cumulative intrusion and polarization resistance (Rpola).

FIG. 5 to FIG. 8 are diagrams explaining a correlation between cumulative intrusion and polarization resistance (Rpola). FIG. 5 explains the correlation between the cumulative intrusion of a plurality of electrodes A, B, and C and the polarization resistance.

Referring to FIG. 5, the cumulative intrusion Vp value decreases in the order of the first electrode A, the second electrode B, and the third electrode C. And, the polarization resistance (Rpola) value increases in the order of the first electrode A, the second electrode B, and the third electrode C. Therefore, it may be seen that the cumulative intrusion Vp value of the electrode and the polarization resistance (Rpola) have an inversely proportional relationship.

Figure 6:
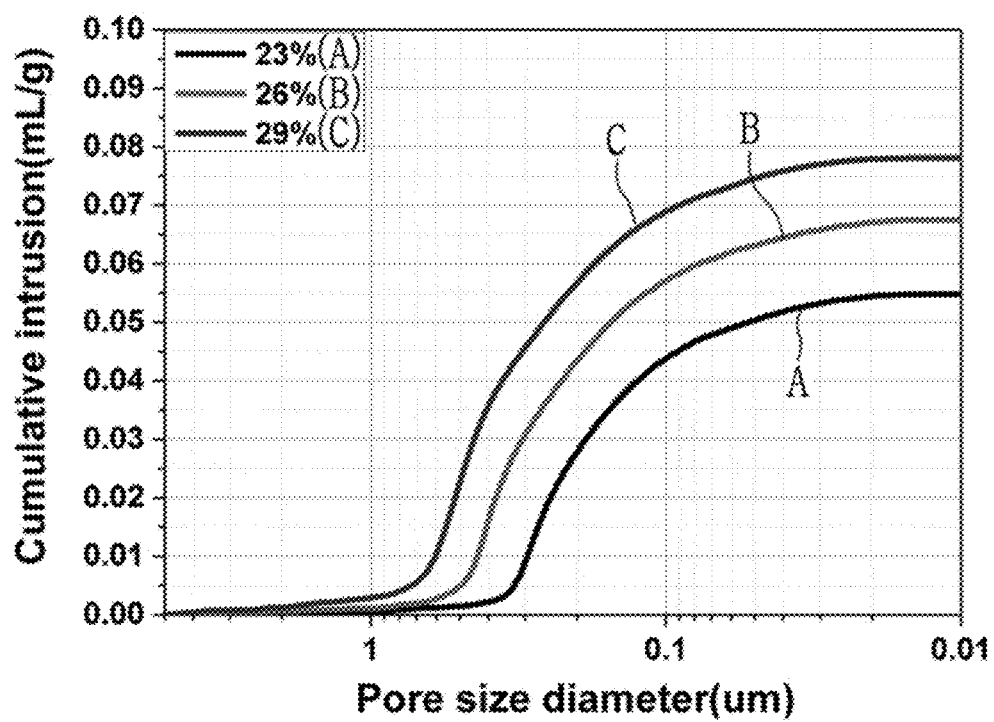
Figure 7:
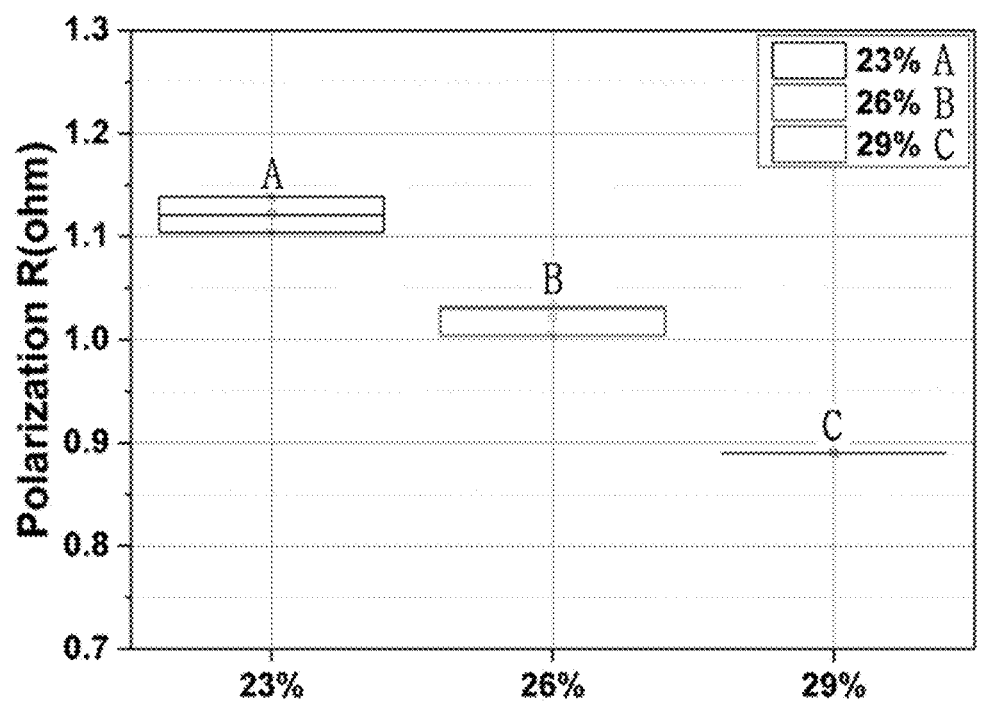

FIG. 6 and FIG. 7 are other example diagrams explaining the correlation between the cumulative intrusion and the polarization resistance (Rpola). FIG. 6 shows the cumulative intrusion measured value depending on the pore size of a plurality of positive electrodes A, B, and C having the different porosities, and FIG. 7 shows the correlation of the cumulative intrusion and the polarization resistance (Rpola) of a plurality of electrodes A, B, and C shown in FIG. 6.

TABLE 1

| | Porosity | A (23%) | B (26%) | C (29%) |
|---|---|---|---|---|
| Current Resistance | End I | 0.57 C | 0.64 C | 0.69 C |
| | Rpola (ohm) | 6.41 | 5.89 | 4.09 |

Table 1 displays the discharge end current (End I) and the polarization resistance (Rpola) value of the continuous discharge output depending on the porosity change of a plurality of positive electrodes A, B, and C shown in FIG. 7. The continuous discharge output performance of the rechargeable battery is better as the discharge end current (End I) value is higher.

Referring to FIG. 6 and FIG. 7 and Table 1, as the cumulative intrusion value increases (A<B<C), the polarization resistance (Rpola) value decreases (A>B>C), and the output performance increases (A<B<C). Accordingly, as the cumulative intrusion value increases (A<B<C), the output performance also increases (A<B<C).

Figure 8:
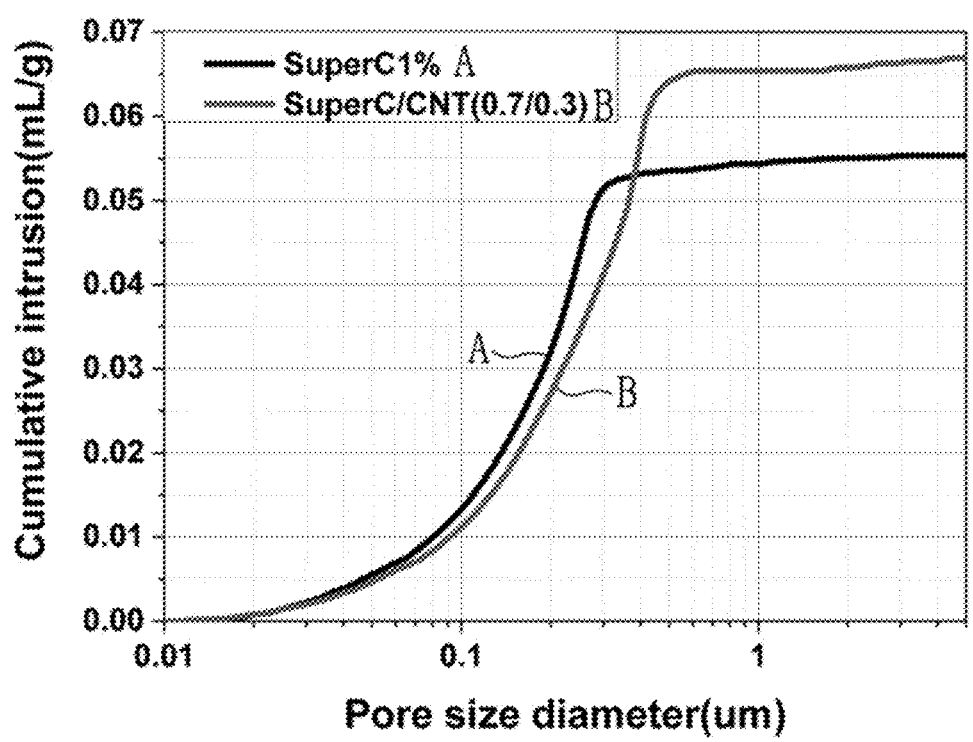

FIG. 8 shows the cumulative intrusion measured value depending on the pore size of a plurality of positive electrodes A and B having different positive electrode conductive materials.

TABLE 2

| Low temperature output resistance | | A (Super C (1%)) | B(CNT/$F_X$35 (0.7/0.3)) |
|---|---|---|---|
| Current | End I | 0.68 C | 0.73 C |
| Rpola | | 6.1 | 5.5 |

Table 2 shows the discharge end current (End I) and the polarization resistance (Rpola) value of the continuous discharge output depending on the conductive material change of a plurality of positive electrodes A and B shown in FIG. 8. The continuous discharge output performance of the rechargeable battery is better as the discharge end current (End I) value is higher.

Referring to FIG. 8 and Table 2, a pore formation varies depending on the type of the conductive material of the positive electrode, which may be expressed as cumulative intrusion. Compared to the first electrode A using only the first conductive material (Super C), the second electrode B using both the first conductive material (Super C) and the second conductive material (CNT) have the higher cumulative intrusion value (A\u003cB) and the smaller polarization resistance (Rpola)) value (A<B), and the larger output performance (A<B).

Figure 9:
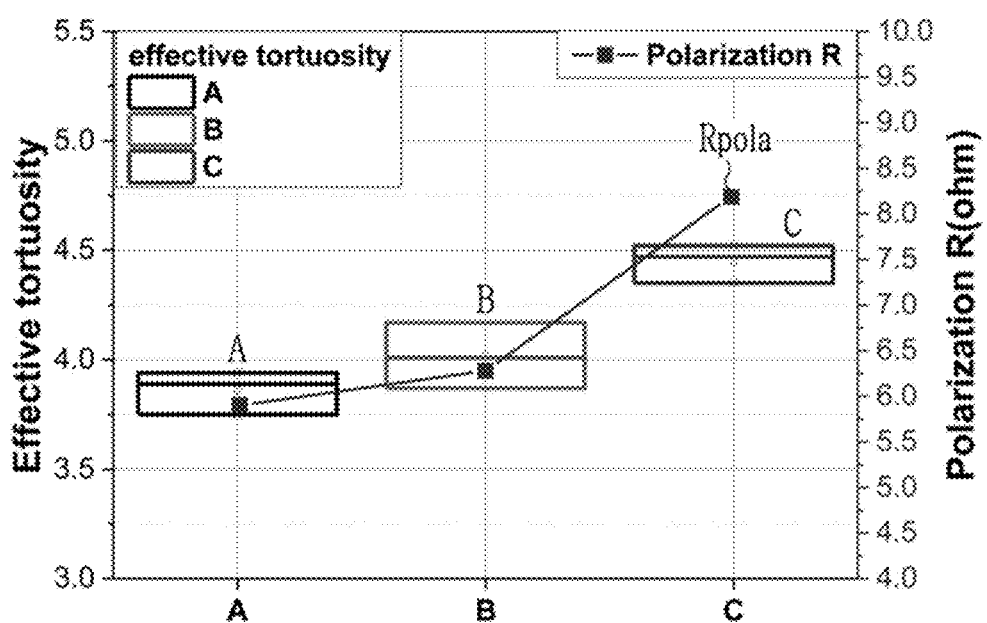
FIG. 9 is a diagram explaining a correlation between tortuosity and polarization resistance (Rpola).

FIG. 9 is a diagram explaining a correlation between tortuosity and polarization resistance (Rpola). The movement of the ions has a characteristic that depends on the structure of the pores formed in the electrode. That is, the movement of the ions depends on the tortuosity corresponding to the structure of the pores formed in the electrode.

In summary, when the tortuosity value increases (A<B<C), the polarization resistance (Rpola) value also increases (A<B<C). In other words, when the tortuosity value decreases (A>B>C), the polarization resistance (Rpola) value also decreases (A>B>C).

Figure 10:
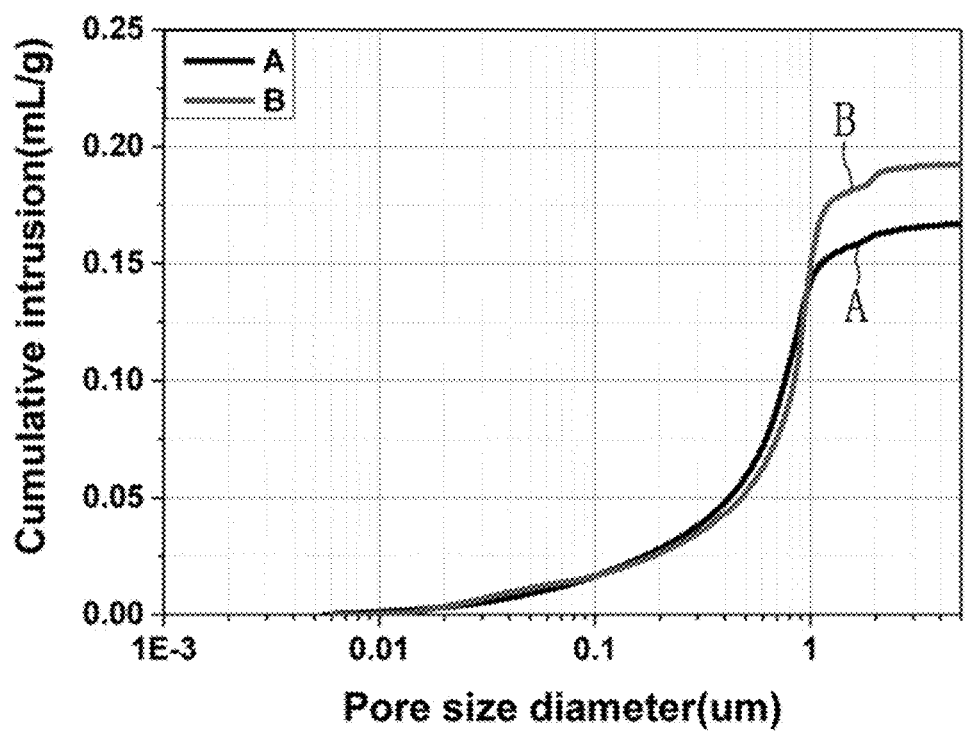
FIG. 10 and FIG. 11 are diagrams explaining a correlation between cumulative intrusion and battery performance.
Figure 11:
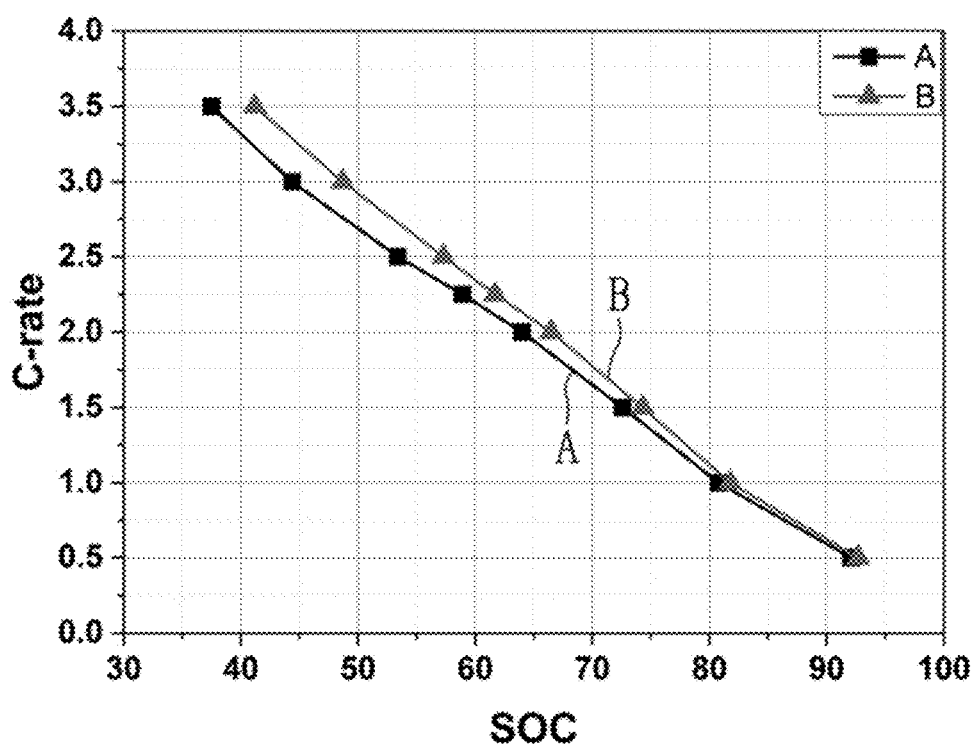

FIG. 10 and FIG. 11 are diagrams explaining a correlation between cumulative intrusion and battery performance. FIG. 10 shows the first electrode A and the second electrode B having the different cumulative intrusion values, and FIG. 11 shows the charge end SOC value of each of the first electrode A and the second electrode B of FIG. 10.

In the negative electrode, as the cumulative intrusion value is larger, the ion movement speed is improved and the charge end SOC is higher during the charging. In summary, for the negative electrodes, the cumulative intrusion may be an indicator of the charging performance because the pore-forming structure affects the charging performance.

Referring to FIG. 10, for the Y-axis value corresponding to 1 micrometer of the diameter of the pore diameter in the X-axis, that is, for the cumulative intrusion value, the first electrode A has about 0.15 (mL/g) and the second electrode B has about 0.175 (mL/g). That is, the cumulative intrusion value of the first electrode A is smaller than that of the second electrode B. Also, even when comparing the Y-axis value, i.e., the cumulative intrusion, in the region where the pore diameter on the X-axis is 1 micrometer or more, the first electrode A value is smaller than that of the second electrode B (A<B).

Referring to FIG. 11, the charge end SOC value of the first electrode A is smaller than the charge end SOC value of the second electrode B (A<B).

In summary, when the cumulative intrusion value is small (A<B), the battery charging performance is also not good (A<B). That is, when the cumulative intrusion value is large (A<B), the battery charging performance is also good (A<B).

FIG. 12 to FIG. 21 are diagrams explaining a correlation between polarization resistance (Rpola) and battery performance.

Figure 12:
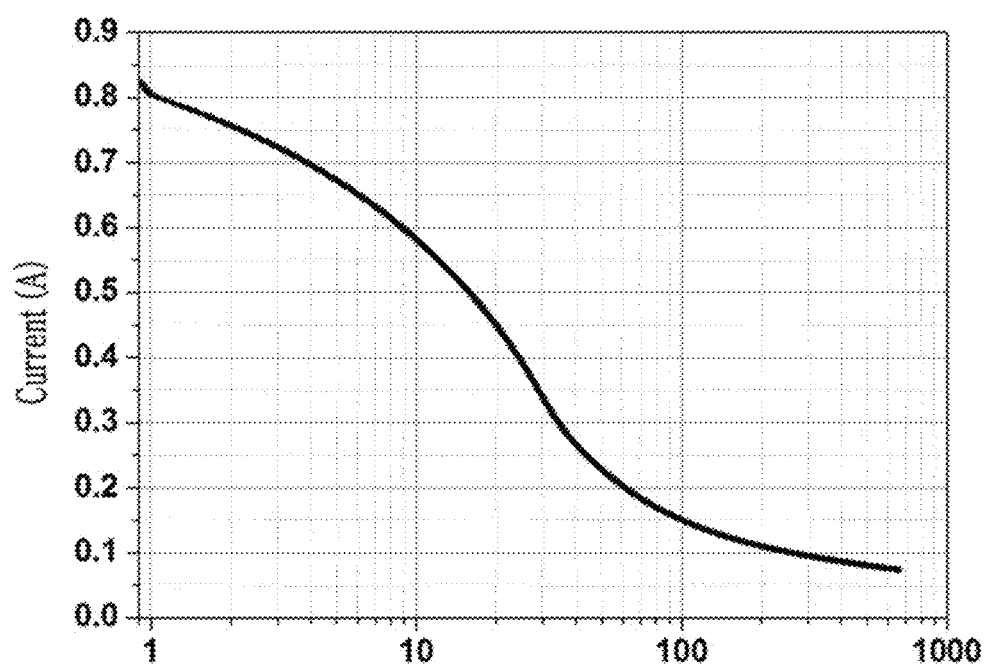
FIG. 12 to FIG. 21 are diagrams explaining a correlation between polarization resistance (Rpola) and battery performance.

FIG. 12 displays the discharge current measured while discharging the rechargeable battery with the constant voltage (CV).

In detail, to confirm the correlation of the polarization resistance (Rpola) and the battery performance, a rechargeable battery performance estimation system (not shown) may measure the discharge current output from the rechargeable battery while discharging the rechargeable battery with the constant voltage (CV) mode after discharging with the constant current (CC) mode during a predetermined time (e.g., 1 s). According to another embodiment, the rechargeable battery performance estimation system (not shown) may perform a discharge test and transmit experimental data and an analysis result, which is a performance result, to the apparatus 100 for estimating the rechargeable battery performance.

For example, if the movement speed of lithium ions (Li$^+$) is improved by changing the positive electrode additive, the porosity of the positive electrode, the negative active material, etc., the output of the rechargeable battery is also improved. When the rechargeable battery is continuously discharged for a predetermined time and the state-of-charge (SOC) of the rechargeable battery decreases and reaches a predetermined value (e.g., SOC 30%, etc.), a section in which the output performance drops rapidly may occur. At this time, the researcher and the like may want to check how much the output performance of the rechargeable battery is improved in the corresponding section by changing the positive electrode additive, the porosity of the positive electrode, the negative active material, etc. At this time, a starting point of the section may be set as the state-of-charge (SOC) of the rechargeable battery. Also, the voltage value corresponding to the state-of-charge (SOC) may be set as a reference voltage.

The rechargeable battery performance estimation system may set a discharge section where the rechargeable battery is discharged with the constant voltage (CV) based on the state-of-charge (SOC) of the rechargeable battery. For example, the rechargeable battery performance estimation system starts a constant voltage (CV) discharge for discharging the rechargeable battery with a predetermined constant voltage (CV), if the state-of-charge (SOC) of the rechargeable battery in real time reaches a first state-of-charge (SOC) (e.g., SOC 35%). In addition, the rechargeable battery performance estimation system, when the real-time state-of-charge (SOC) of the rechargeable battery reaches a second state-of-charge (SOC) (e.g., SOC 20%), controls a discharger 20 to end the constant voltage (CV) discharge of the rechargeable battery. That is, the rechargeable battery performance estimation system may discharge the rechargeable battery with the constant voltage (CV) in the discharge section in which a starting point is set as SOC 35% and an end point is set as SOC 20%. In this case, the time corresponding to the discharge section is defined as a discharge period. In FIG. 12, the discharge period may be viewed as a period between 0 s and about 700 s.

For example, FIG. 12 shows a discharge current according to a time passage calculated in an experimental condition in which the constant voltage (CV) discharge of the rechargeable battery is ended when the constant voltage (CV) discharge of the rechargeable battery starts and the state-of-charge (SOC) reaches 20% at the time that the state-of-charge (SOC) is 35% and the reference voltage is 2.5 V.

Figure 13:
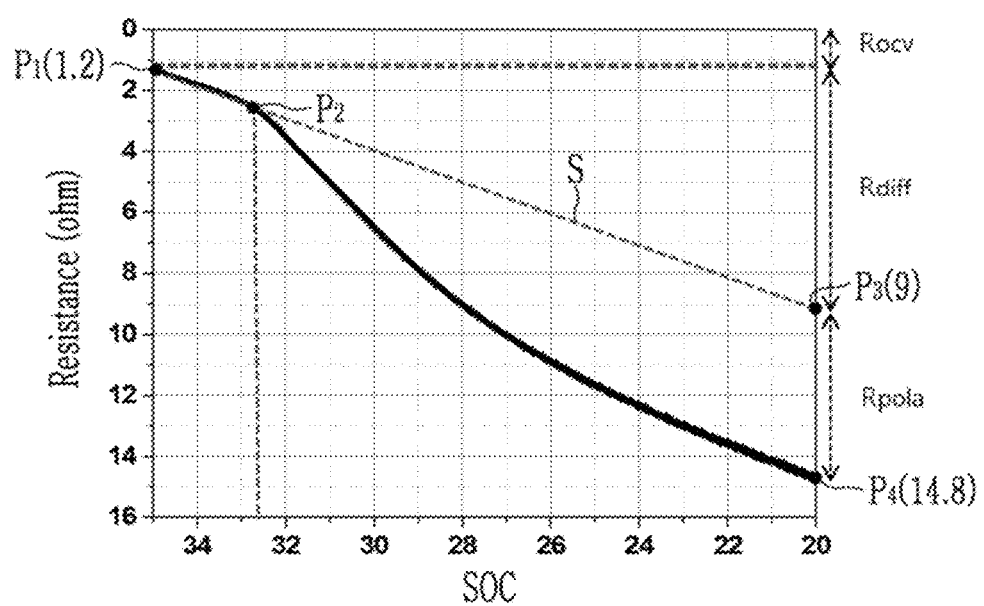

FIG. 13 shows the relationship of the resistance change according to the SOC change during the discharge period for FIG. 12.

The rechargeable battery performance estimation system, during the discharge period, may estimate the SOC at each point in the graph of FIG. 12. Since the test is the constant voltage (CV) discharge, the voltage is constant, and the change in the current depending on the time passage may be found in FIG. 12. In addition, since the SOC value corresponding to each time may also be known, the rechargeable battery performance estimation system may derive the relationship of the resistance change according to the SOC change during the discharge period. For example, the rechargeable battery performance estimation system may calculate the relationship of the resistance change according to the SOC change during the discharge period based on FIG. 12 with the same graph as FIG. 13.

The rechargeable battery performance estimation system may calculate the polarization resistance (Rpola) from the graph shown in FIG. 13. First, the rechargeable battery performance estimation system calculates a resistance value of a first resistance (Rohmic) which is a resistance due to the voltage drop of the rechargeable battery based on the resistance change relation depending on the SOC change during the discharge period. The resistance value of the first resistance (Rohmic) corresponds to a sum value of resistance values of an electrical resistance (Rohm) derived according to the electrical characteristic of the rechargeable battery, a charge transfer resistance (Rct), and a resistance (Rocv) by a change in an open circuit voltage (OCV).

For example, the first resistance (Rohmic) may appear within about 0.1 seconds when the rechargeable battery is discharged to the constant voltage (CV). Therefore, the rechargeable battery performance estimation system, in the graph of FIG. 5, may set the resistance developed at the time of the discharge period, more precisely, after 0.1 seconds as the resistance value of the first resistance (Rohmic).

The rechargeable battery performance estimation system calculates a second resistance (Rdiff), which is a resistance that occurs as the ions are inserted into the active material of the rechargeable battery. In addition, the second resistance (Rdiff) may be defined as the resistance (Rdiff) by the diffusion of the electrolyte in another expression.

Referring to FIG. 13, the rechargeable battery performance estimation system may calculate the resistance value (e.g., 9 ohm) at the end point P3 of the discharge period as an upper limit value of the second resistance (Rdiff) on an extending line S connecting a first point P1 corresponding to the resistance value of the start time of the discharge period and a second point P2 where a resistance change ratio for the SOC change on the resistance change relationship for the SOC change exceeds a first reference value. The rechargeable battery performance estimation system may calculate the resistance value (e.g., 7.8 ohm) of the second resistance (Rdiff) based on the difference (9−1.2=7.8 ohm) of the upper limit value of the second resistance (Rdiff) and the resistance value (e.g., 1.2 ohm) of the first resistance (Rohmic). Here, the second point P2 may be defined as a point where the slope change is abrupt in the resistance change relation graph according to the SOC change, that is, the point where the slope exceeds a first predetermined reference value.

The rechargeable battery performance estimation system may calculate a third resistance (Ppola) which is a polarization resistance generated by the movement of the ions in the rechargeable battery. The rechargeable battery performance estimation system, referring to FIG. 13, may calculate the resistance value (e.g., 5.8 ohm) of the third resistance (Ppola) based on the difference (14.8−9=5.8 ohm) of the resistance value (e.g., 14.8 ohm) of the end point P4 of the discharge period and the upper limit value (e.g., 9 ohm) of the second resistance.

Figure 14:
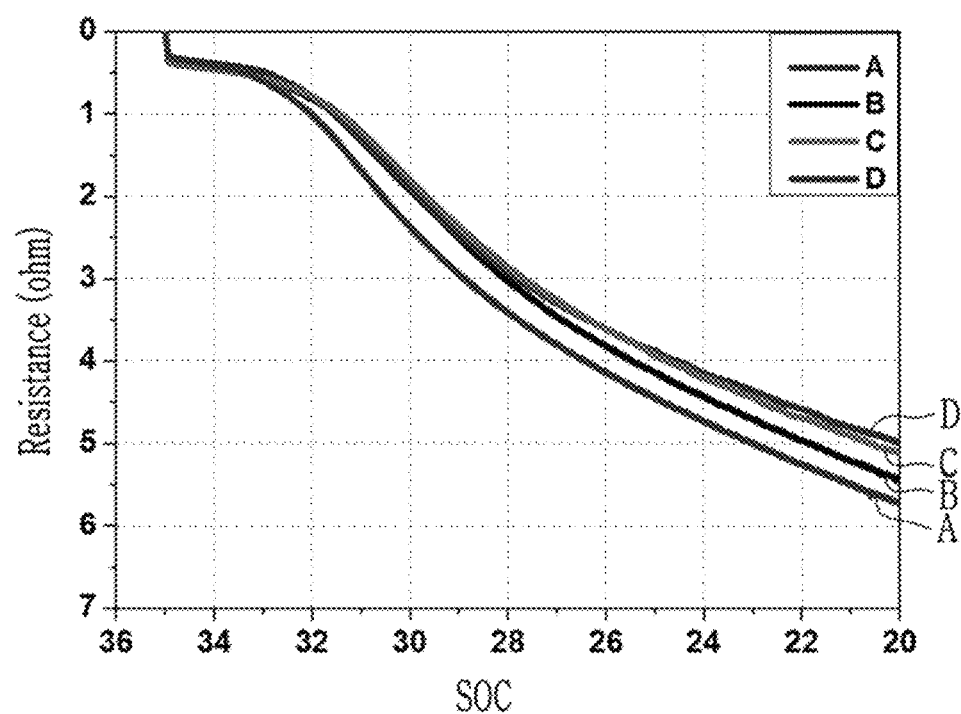
Figure 15:
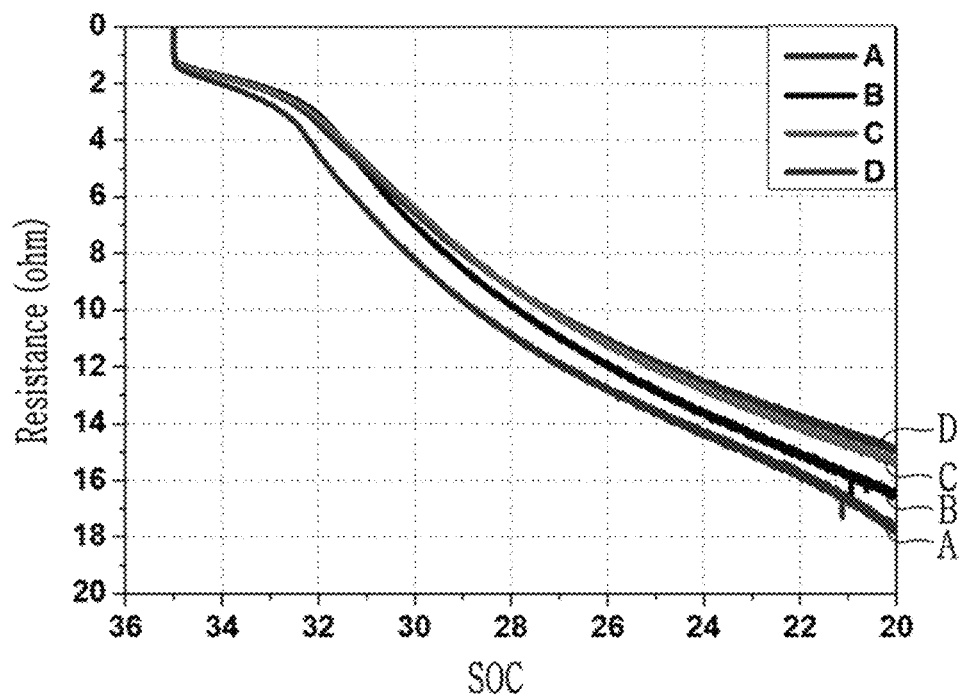

FIG. 14 and FIG. 15 show the experimental results of the output performance at room temperature and a low temperature, respectively.

FIG. 14 displays the resistance change relation according to the SOC change during the discharge period, derived by performing the discharge test for each of a plurality of electrodes A, B, C, and D with the constant voltage (CV) at room temperature (e.g., 25° C.) and a predetermined starting condition (15 C and 2.5 V). FIG. 15 displays the resistance change relation according to the SOC change during the discharge period, derived by performing the discharge test for each of a plurality of electrodes A, B, C, and D with the constant voltage (CV)) at a low temperature (e.g., −10° C.) and a predetermined starting condition (5.5 C and 2.5 V). A plurality of electrodes A, B, C, and D and other conditions are the same, and only the temperature and the starting conditions are differentiated, and the discharge test is performed. The discharge test is to measure the discharge current output from the rechargeable battery during the discharge period that is a period that the rechargeable battery is discharged with the constant current (CC) and the constant voltage (CV) and is discharged with the constant voltage (CV).

TABLE 3

| SET | −10° C. 5.5 C, 2.5 V CV | | 25° C. 15 C, 2.5 V CV | |
|---|---|---|---|---|
| | End I (C-rate) | R (ohm) | End I (C-rate) | R (ohm) |
| A | 0.43 | 17.7 | 1.33 | 5.7 |
| B | 0.45 | 16.5 | 1.36 | 5.5 |
| C | 0.48 | 15.3 | 1.46 | 5.1 |
| D | 0.50 | 14.9 | 1.48 | 5.0 |

Table 3 displays the discharge end current (End I) and the polarization resistance (Rpola) value of the continuous discharge output of each of a plurality of electrodes A, B, C, and D, which are calculated based on FIG. 14 and FIG. 15. Referring to Table 3, regardless of the temperature and starting condition, it may be confirmed that as the polarization resistance (Rpola) value decreases (A>B>C>D), the discharge end current (End I) value is high. At this time, the continuous discharge output performance of the rechargeable battery is better as the discharge end current (End I) value is higher.

Therefore, it may be confirmed that the polarization resistance (Rpola) is a factor that indicates the performance of the rechargeable battery regardless of the temperature.

Figure 16:
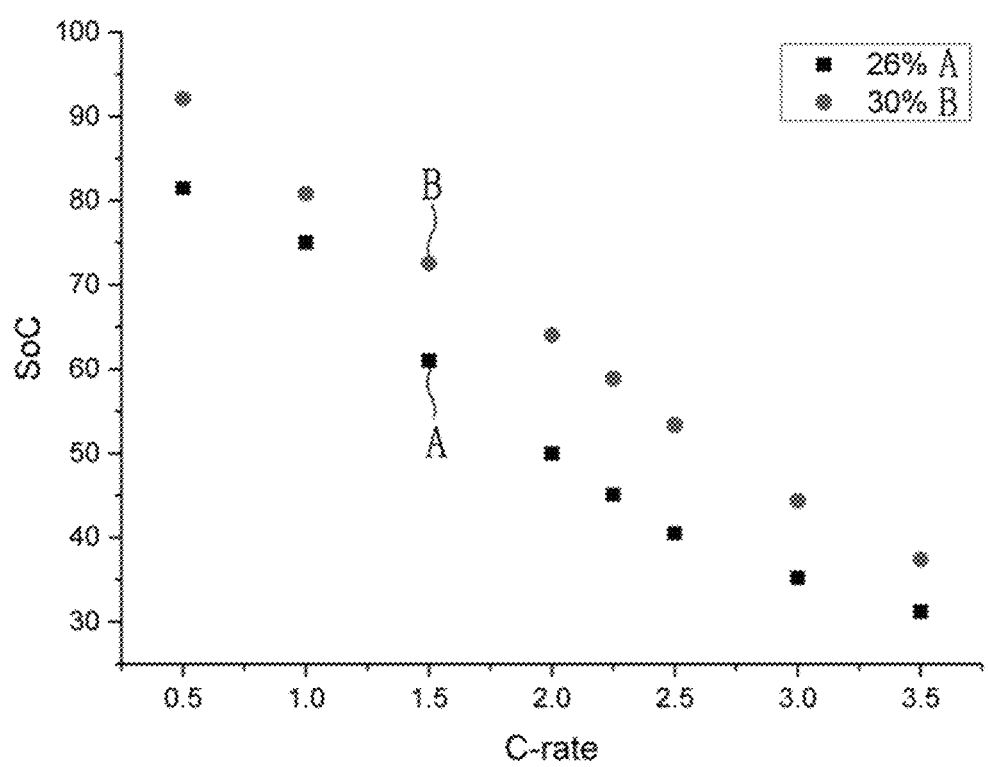
Figure 17:
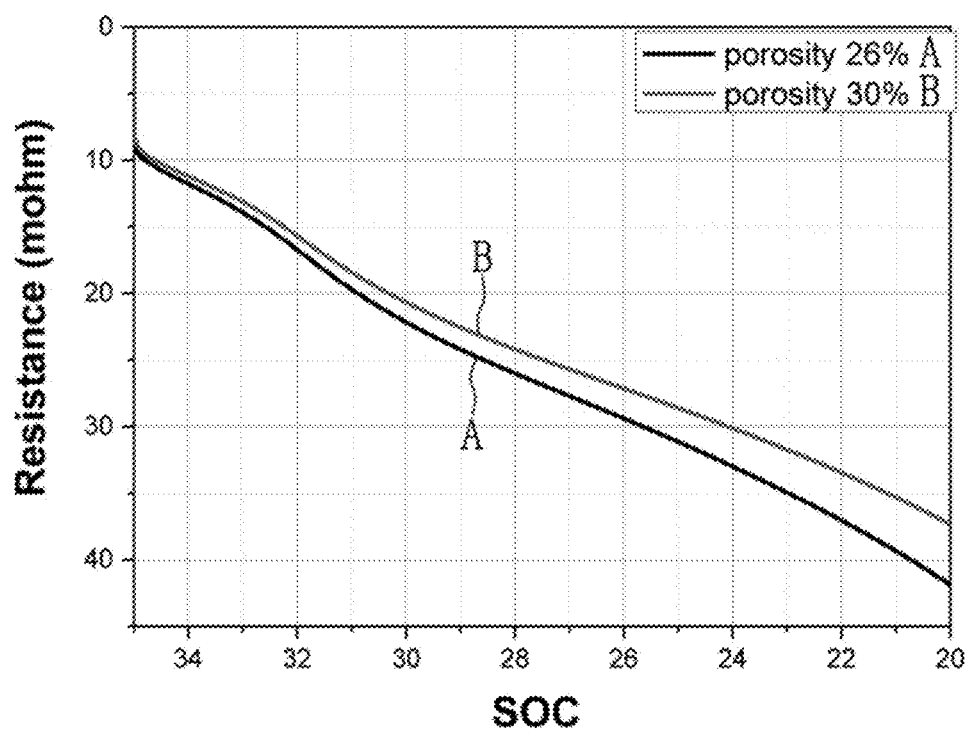

FIG. 16 and FIG. 17 show the correlation between the polarization resistance (Rpola) and the charge end SOC.

The first electrode A has porosity of 26%, and the second electrode B has porosity of 30%.

TABLE 4

| Negative electrode porosity | A (26%) | B (30%) |
|---|---|---|
| Rpola (mohm) | 2 | 3.7 |

Table 4 displays the polarization resistance (Rpola) value of the first electrode A and the second electrode B, which the graph of FIG. 17 is calculated by the method described in FIG. 13.

Referring to FIG. 16 and Table 4, it may be confirmed that the polarization resistance (Rpola) value of the first electrode A is smaller than the polarization resistance (Rpola) value of the second electrode B, and the charge end SOC value of the first electrode A is smaller than the charge end SOC value of the second electrode B.

Figure 18:
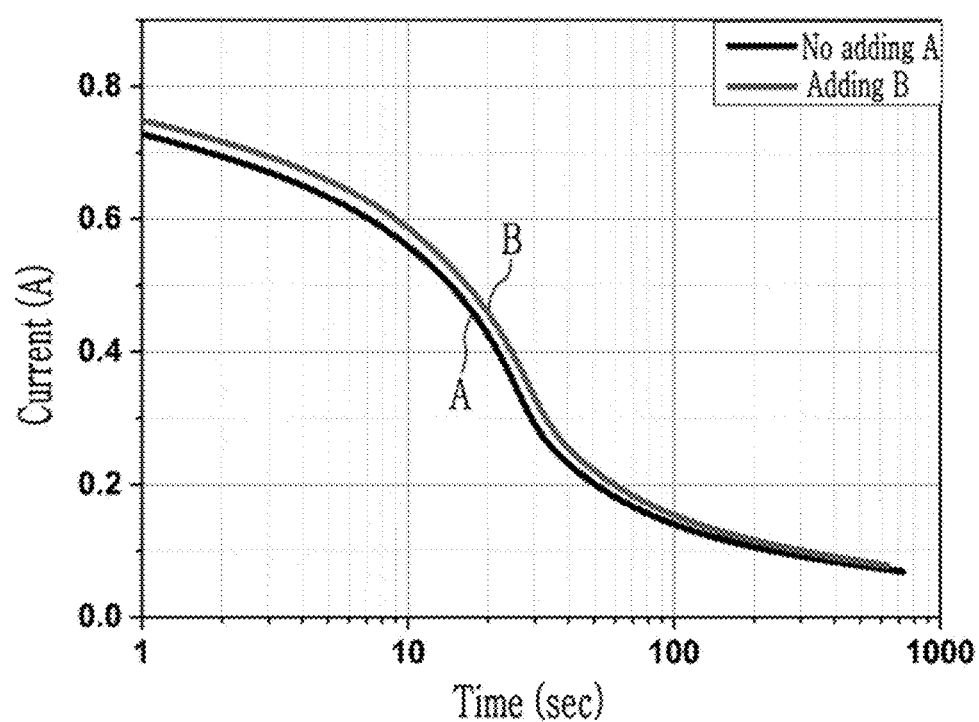
Figure 19:
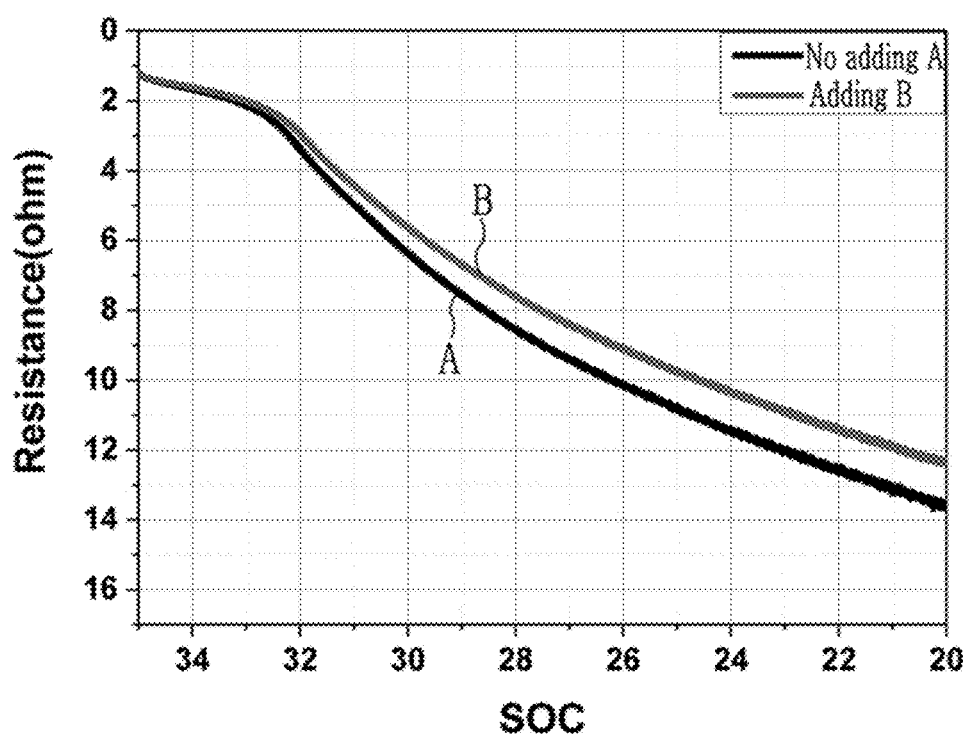

FIG. 18 and FIG. 19 are diagrams showing the correlation between polarization resistance (Rpola) and the discharge end current (End I).

FIG. 18 shows the discharge current value according to the passage of time as the discharge test result for the first electrode A without adding the positive electrode additive and the second electrode B to which the positive electrode additive is added. FIG. 19 is a view showing the resistance change depending on the SOC change of the first electrode A and the second electrode B based on FIG. 18.

TABLE 5

| Negative electrode additive | | A (No adding) | B (adding) |
|---|---|---|---|
| Current Resistance | End I | 0.51 C | 0.56 C |
| | Rohmic (ohm) | 1.35 | 1.33 |
| | Rdiff (ohm) | 5.62 | 5.13 |
| | Rpola (ohm) | 6.62 | 5.93 |

Table 5 displays the polarization resistance (Rpola) value of the first electrode A and the second electrode B obtained by the method described in FIG. 13 for the graph of FIG. 19, and the discharge end current (End I) of the first electrode A and the second electrode B obtained by the discharge test. Referring to Table 5, if the ion conductivity is improved by the addition of the positive electrode additive, the polarization resistance (Rpola) decreases (A>B).

Figure 20:
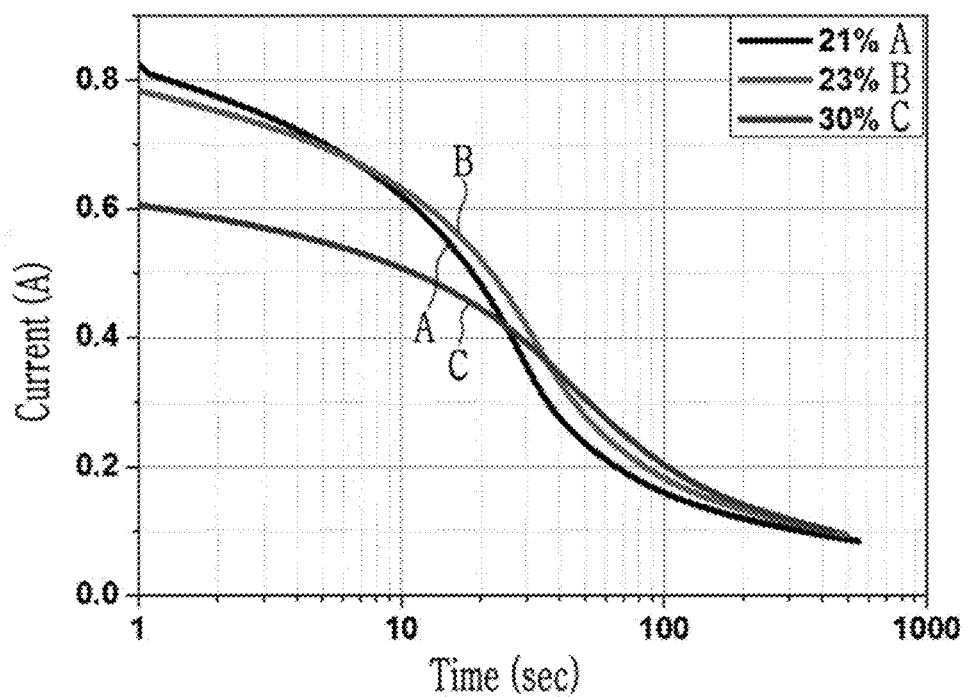
Figure 21:
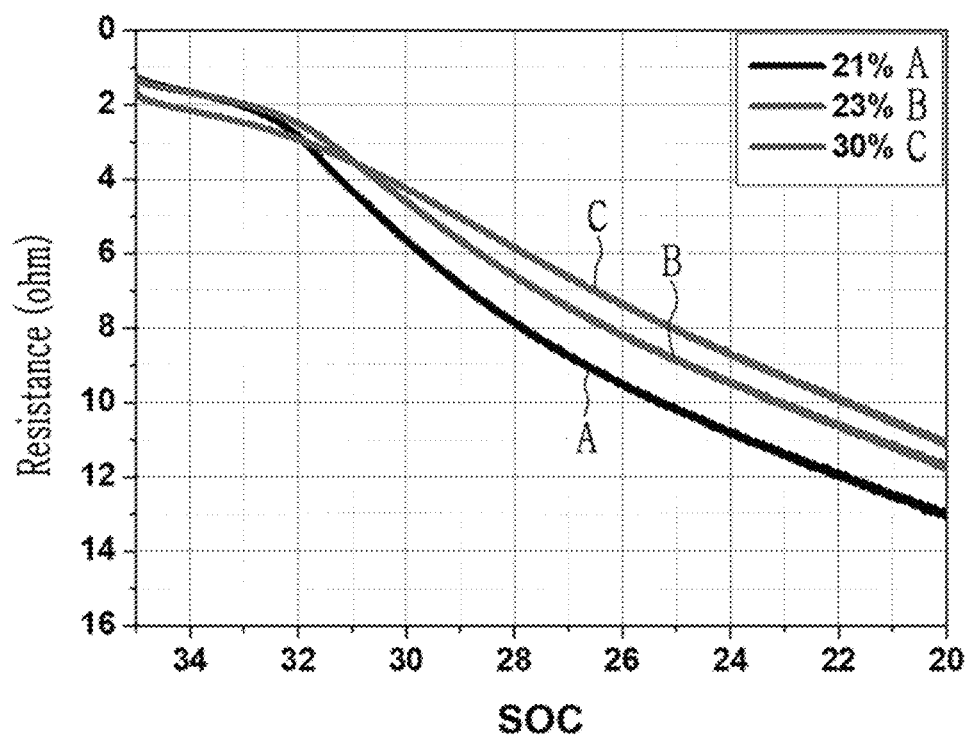

FIG. 20 and FIG. 21 are other diagrams showing the correlation between the polarization resistance (Rpola) and the discharge end current (End I).

FIG. 20 shows the discharge current value depending on time passage, which is a discharge test result for a plurality of electrodes A, B, and C having different porosity of the positive electrode. FIG. 21 is a drawing showing the resistance change according to the SOC change of a plurality of electrodes A, B, and C based on FIG. 20. The first electrode A has porosity of 21%, the second electrode B has porosity of 23%, and the third electrode C has porosity of 30%.

TABLE 6

|  | Porosity | A (21%) | B (23%) | C (30%) |
|---|---|---|---|---|
| Current Resistance | End I | 0.57 C | 0.64 C | 0.69 C |
|  | Rohmic (ohm) | 1.34 | 1.41 | 1.82 |
|  | Rdiff (ohm) | 5.35 | 4.5 | 5.23 |
|  | Rpola (ohm) | 6.41 | 5.89 | 4.09 |

Table 6 shows the polarization resistance (Rpola) and the discharge end current (End I) for a plurality of electrodes A, B, and C, which are calculated by the method described in FIG. 13 for the graph of FIG. 21. Referring to Table 5, when the polarization resistance (Rpola) value is lowered (A>B>C) due to the increasing of the porosity and the improved ion conductivity, the discharge end current (End I) is increased (A<B<C).

FIG. 22 to FIG. 26 are drawings explaining the size of pores that affect the battery performance.

When explaining with reference to FIG. 3 to FIG. 21, the pores that affect the cumulative intrusion value, the tortuosity value, the polarization resistance (Rpola) value, and the battery performance are pores with the diameter of 0.1 micrometer or more and 1 micrometer or less. That is, the diameter of the pores that affects the cumulative intrusion value is 0.1 micrometer or more and 1 micrometer or less.

Figure 22:
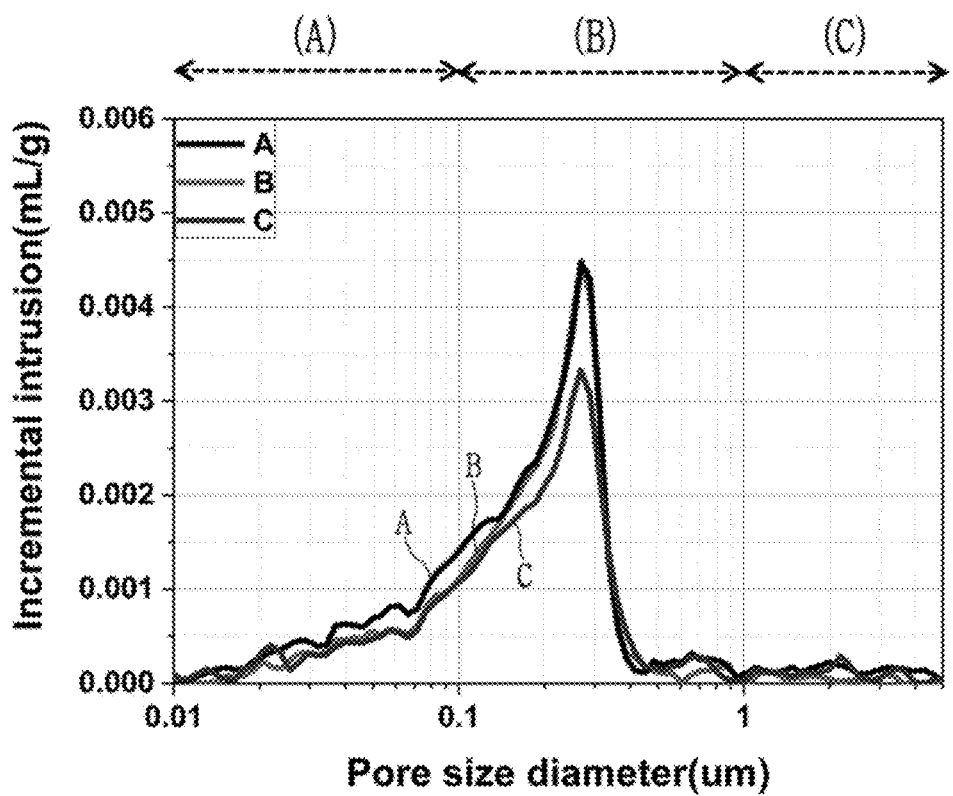
FIG. 22 to FIG. 26 are views explaining a size of pores that affect battery performance.

FIG. 22 denotes a volume (mL) occupied by the pores having the corresponding diameter per unit mass (g) of the electrode according to the change in pore diameter (pore size diameter) in a plurality of electrodes A, B, and C, respectively. That is, the X-axis is the diameter (the pore size diameter) of the pores, and the Y-axis is the entire volume of the pores with a specific diameter indicated on the X-axis.

Specifically, in FIG. 22, the incremental intrusion of the Y-axis represents the entire volume of the pores having each specific diameter on the X-axis, and there is a difference from the above-described cumulative intrusion indicating the entire volume of all pores below the corresponding diameter indicated on the X-axis. For example, referring to FIG. 22, the volume occupied by the pores having the size of 0.1 micrometer or more and 1 micrometer or less in the diameter is the largest.

Figure 23:
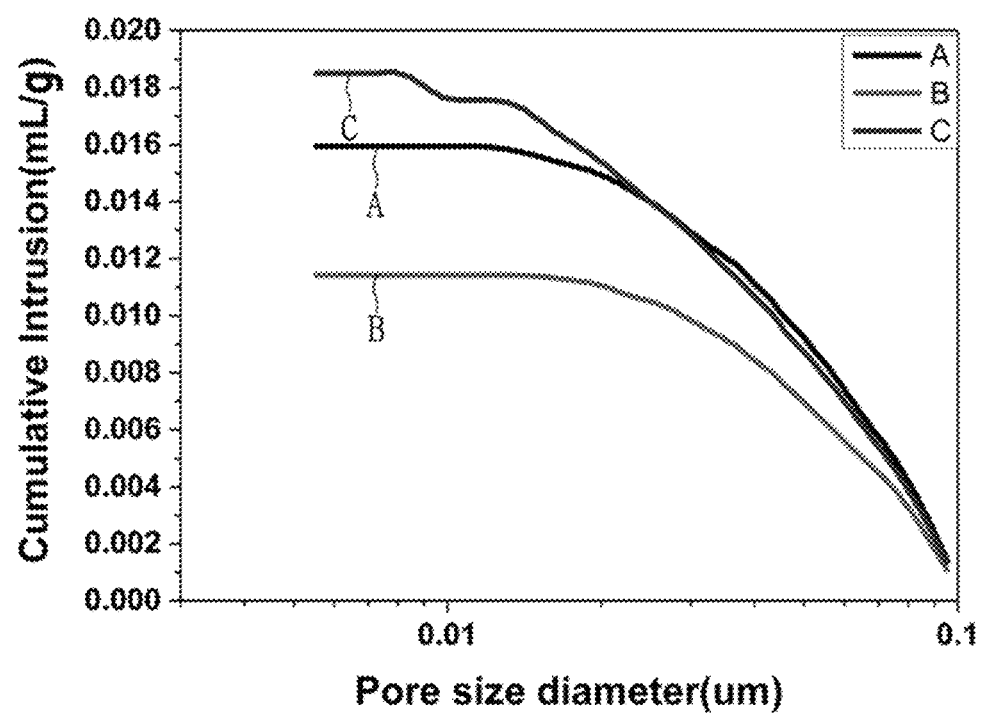
Figure 24:
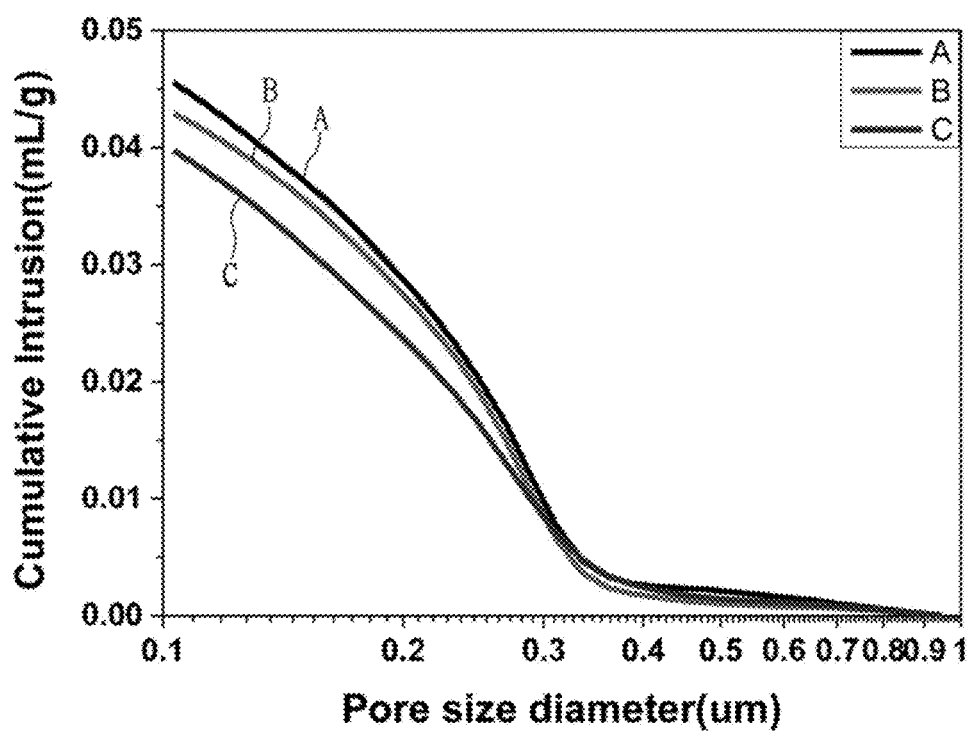
Figure 25:
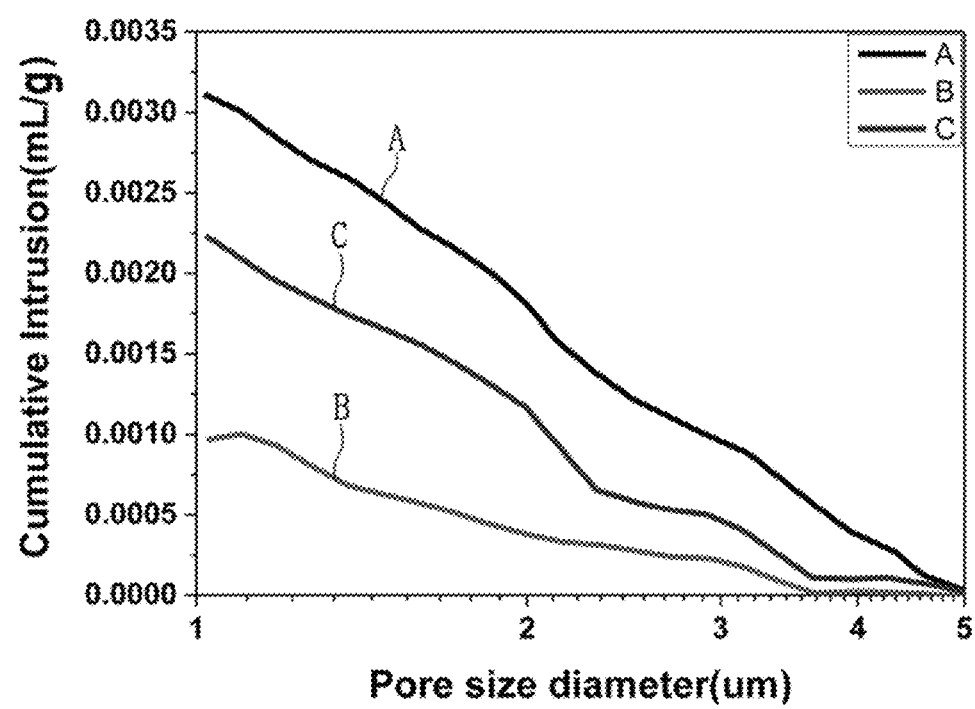

FIG. 23 represents the cumulative intrusion for the area (A) of FIG. 21 for each of a plurality of electrodes A, B, and C, FIG. 24 represents the cumulative intrusion for the area (B) of FIG. 21, and FIG. 25 represents the cumulative intrusion for the area (C) of FIG. 21.

Figure 26:
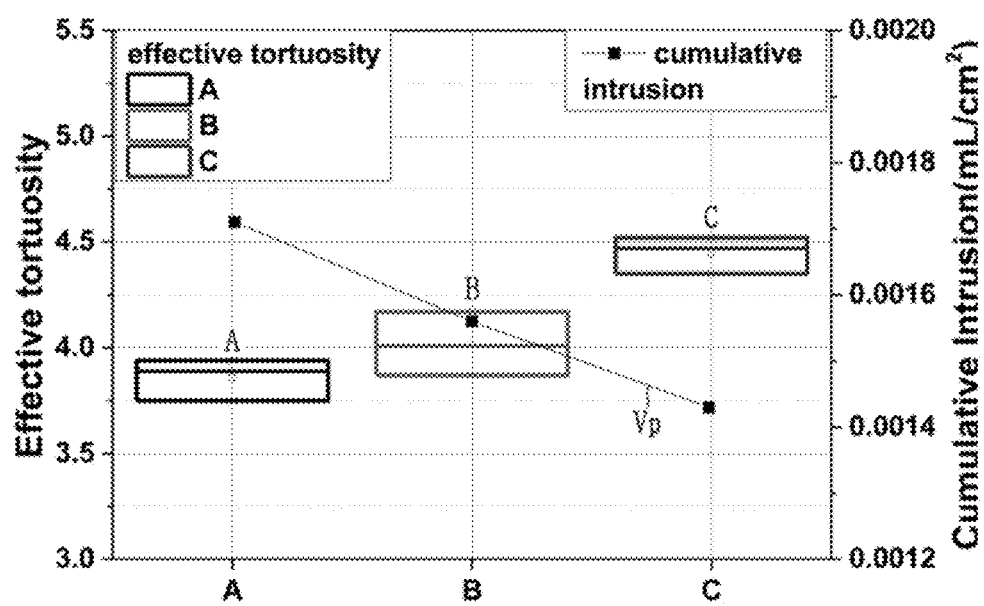

FIG. 26 is a diagram for explaining the correlation between the cumulative intrusion (Vp) and the tortuosity of a plurality of electrodes A, B, and C, respectively. Referring to FIG. 26, the cumulative intrusion Vp is the largest in the first electrode A, followed by the second electrode B and the third electrode C in order (A>B>C). In addition, the tortuosity is opposite to the cumulative intrusion Vp value of each of the first electrode A, the second electrode B, and the third electrode C, and the first electrode A is the smallest, then followed by the second electrode B and the third electrode C in the order (A<B<C).

Referring to FIG. 23 and FIG. 26, in FIG. 23, the cumulative intrusion value of only pores with the diameter of 0.1 micrometer or less is a large value in the order of the third electrode C, the first electrode A, and the second electrode B (C>A>B). On the other hand, in FIG. 26, the cumulative intrusion Vp value has a large value in the order of the first electrode A, the second electrode B, and the third electrode C (A>B>C).

In summary, the pores with the diameter of 0.1 micrometer or less do not affect the tortuosity.

Referring to FIG. 24 and FIG. 26, in FIG. 24, the cumulative intrusion value of only the pores with the diameter of 0.1 micrometer or more and 1 micrometer or less shows the order of the first electrode A, the second electrode B, and the third electrode C (A>B>C). This, as shown in FIG. 26, it is the same as the size ratio of the cumulative intrusion Vp, showing the correlation that is inversely proportional to the tortuosity (A>B>C).

In summary, the pores with the diameter of 0.1 micrometer or more and 1 micrometer or less have the effect on the tortuosity, etc.

Referring to FIG. 25 and FIG. 26, in FIG. 25, the cumulative intrusion value of only the pores with the diameter of 1 micrometer or more and 5 micrometers or less shows the order of the first electrode A, the third electrode C, and the second electrode B (A>C>B). On the other hand, as shown in FIG. 26, the cumulative intrusion Vp value, which shows an inversely proportional relationship to the tortuosity, has the largest value in the order of the first electrode A, the second electrode B, and the third electrode C (A>B>C).

In summary, the pores with the diameter of 1 micrometer or more and 5 micrometers or less do not affect the tortuosity.

Summarizing the experimental results shown in FIG. 22 to FIG. 26, the pores affecting the cumulative intrusion (Vp) value, the tortuosity value, the polarization resistance (Rpola) value, and the battery performance are the pores with the diameter of 0.1 micrometer or more and less than 1 micrometer.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. An apparatus for estimating a rechargeable battery performance, the apparatus comprising:
    a communication unit that receives a cumulative intrusion value that is a summed value of volumes of entire pores per unit area of a positive electrode from an apparatus for measuring volumes of pores formed in the positive electrode; and
    a processor that estimates an output performance of a rechargeable battery by comparing the cumulative intrusion value and a volume reference value,
    wherein the volume reference value is a cumulative intrusion value corresponding to an expected output value required for the rechargeable battery when the rechargeable battery is continuously discharged.

2. The apparatus for estimating the rechargeable battery performance of claim 1, wherein the pores have a diameter of 0.1 micrometer or more and 1 micrometer or less.

3. The apparatus for estimating the rechargeable battery performance of claim 2, wherein the processor, when the cumulative intrusion value is equal to or greater than the volume reference value, determines that the rechargeable battery including the positive electrode satisfies the expected output value.

4. An apparatus for estimating a rechargeable battery performance, the apparatus comprising:

a communication unit that receives a cumulative intrusion value that is a summed value of volumes of entire pores per unit area of a negative electrode from an apparatus for measuring volumes of pores formed in the negative electrode; and a processor that estimates charging performance of a rechargeable battery by comparing the cumulative intrusion value and a volume reference value, wherein the volume reference value is the cumulative intrusion value corresponding to an expected state-of-charge (SOC) value required for the rechargeable battery at a charge end time when the rechargeable battery is continuously charged.

5. The apparatus for estimating the rechargeable battery performance of claim 4, wherein the pores have a diameter of 0.1 micrometer or more and 1 micrometer or less.

6. The apparatus for estimating the rechargeable battery performance of claim 5, wherein the processor, when the cumulative intrusion value is equal to or greater than the volume reference value, determines that the rechargeable battery including the negative electrode satisfies the expected SOC value.

7. A method for estimating a rechargeable battery performance, the method comprising:

receiving a cumulative intrusion value that is a summed value of volumes of entire pores per unit area of a positive electrode from an apparatus for measuring volumes of pores formed in the positive electrode;

comparing the cumulative intrusion value and a volume reference value; and determining that a rechargeable battery including the positive electrode satisfies an expected output value when being continuously discharged when the cumulative intrusion value is equal to or greater than the volume reference value as a comparison result, wherein the volume reference value is the cumulative intrusion value corresponding to a lowest value of the expected output value.

8. The method for estimating the rechargeable battery performance of claim 7, wherein the pores have a diameter size of 0.1 micrometer or more and 1 micrometer or less.

9. A method for estimating a rechargeable battery performance, the method comprising:

receiving a cumulative intrusion value that is a summed value of volumes of entire pores per unit area of a negative electrode from an apparatus for measuring volumes of pores formed in the negative electrode;

comparing the cumulative intrusion value and a volume reference value; and determining that a rechargeable battery including the negative electrode satisfies an expected state-of-charge (SOC) value at a charge end time when being continuously charged when the cumulative intrusion value is equal to or greater than the volume reference value as the as a comparison result, wherein the volume reference value is the cumulative intrusion value corresponding to the expected SOC value.

10. The method for estimating the rechargeable battery performance of claim 9, wherein the pores have a diameter size of 0.1 micrometer or more and 1 micrometer or less.

* * * * *